United States Patent [19]

Cosimano et al.

[11] Patent Number: 4,906,198
[45] Date of Patent: Mar. 6, 1990

[54] CIRCUIT BOARD ASSEMBLY AND CONTACT PIN FOR USE THEREIN

[75] Inventors: Raymond J. Cosimano, Endicott; Reinhold E. Tomek, Endwell, both of N.Y.

[73] Assignee: International Business Machines Corporation, Armonk, N.Y.

[21] Appl. No.: 282,530

[22] Filed: Dec. 12, 1988

[51] Int. Cl.[4] ............................................. H01R 9/09
[52] U.S. Cl. ...................................... 439/82; 361/414; 439/85
[58] Field of Search .................. 439/55, 78, 81–85; 361/410, 412, 413, 414, 404

[56] References Cited

U.S. PATENT DOCUMENTS

| | | | |
|---|---|---|---|
| 3,545,080 | 12/1970 | Evans | 439/82 |
| 3,875,479 | 4/1975 | Jagger | 361/414 |
| 3,880,486 | 4/1975 | Avakian | 439/82 |
| 3,971,610 | 7/1976 | Buchoff et al. | 439/82 |
| 4,017,143 | 4/1977 | Knowles | 439/873 |
| 4,076,356 | 2/1978 | Tamburro | 439/82 |
| 4,381,134 | 8/1983 | Anselmo et al. | 439/82 |
| 4,475,780 | 10/1984 | Walter | 439/82 |
| 4,530,551 | 7/1985 | Benasutti | 439/78 |
| 4,533,204 | 8/1985 | Moynagh, Jr. | 439/82 |
| 4,548,450 | 10/1985 | Reimer et al. | 439/82 |
| 4,686,607 | 8/1987 | Johnson | 361/412 |
| 4,731,701 | 3/1988 | Kuo | 361/414 |
| 4,736,266 | 5/1988 | Tanibe | 361/414 |
| 4,737,114 | 4/1988 | Yaegashi | 439/82 |
| 4,763,408 | 8/1988 | Heisey et al. | 29/874 |

*Primary Examiner*—Neil Abrams
*Attorney, Agent, or Firm*—Lawrence R. Fraley

[57] ABSTRACT

A circuit assembly (e.g., printed circuit board) including an insulative substrate having opposed surfaces each defining a walled opening therein. Each walled opening includes a layer of conductive material (e.g., copper) plated thereon, these openings being electrically connected through a common channel or the like, which channel in turn has been plated to include copper material therein. Located within each opening is a compliant contact pin including a compliant end portion designed to provide an interference fit within one of the respective openings and an extending portion designed for extending from the board's outer surfaces to be electrically connected to a designated external component (e.g., printed circuit board, wiring, conductive socket). Utilization of opposed pins, walled openings, and a narrow channel as defined herein allows the greater utilization of board internal volume to thus accommodate higher circuit densities particularly in the areas of the insulative board between the spaced apart, plated openings.

15 Claims, 1 Drawing Sheet

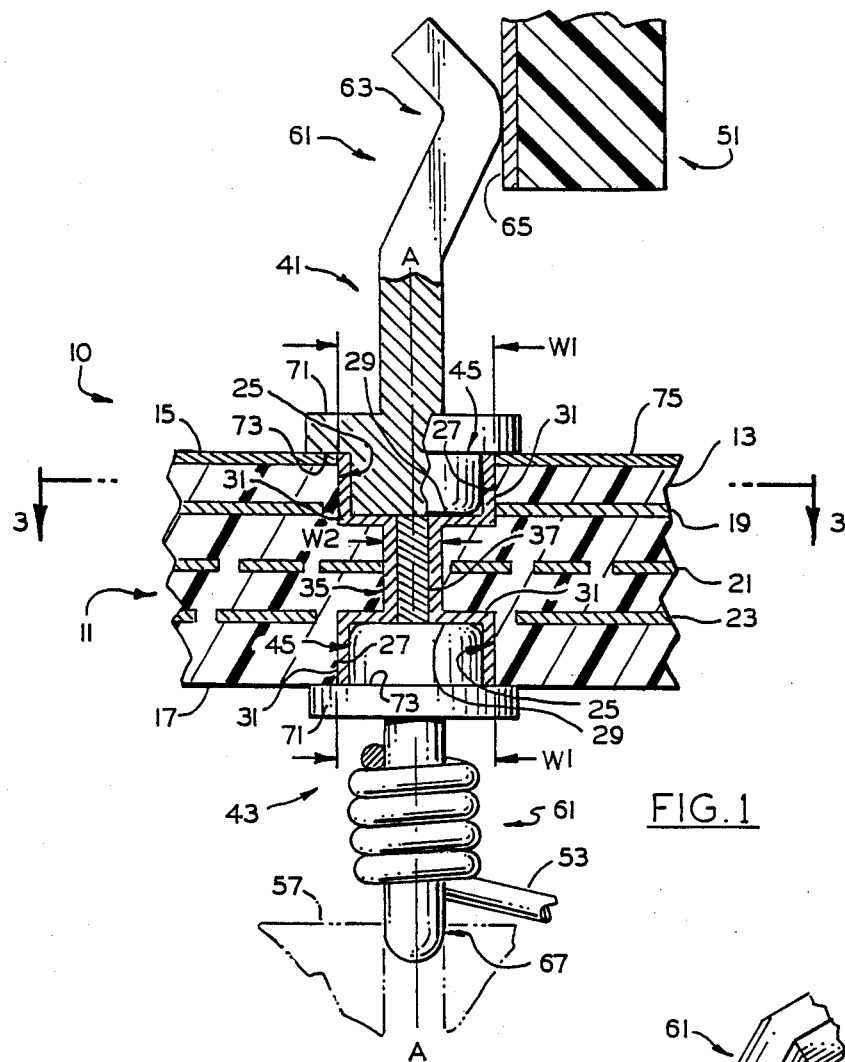
FIG. 1
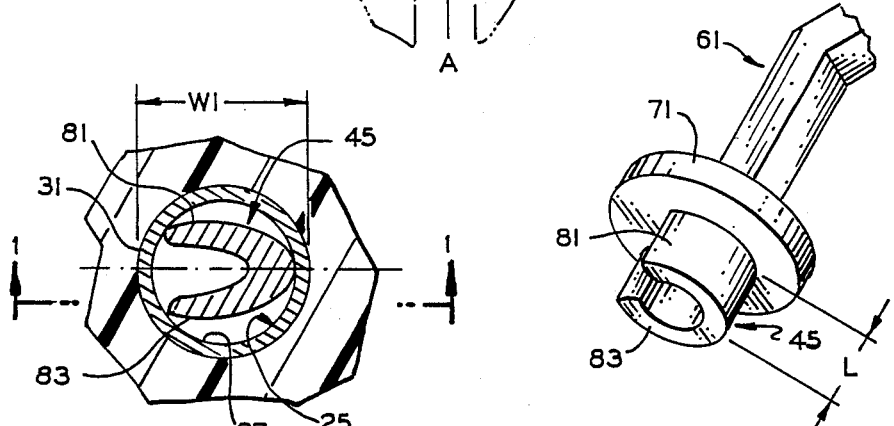
FIG. 3
FIG. 2

CIRCUIT BOARD ASSEMBLY AND CONTACT PIN FOR USE THEREIN

TECHNICAL FIELD

The invention relates to electrical circuit assemblies and particularly to those of the printed circuit board variety as may be used, for example, in various information processing systems (computers). Even more particularly, the invention relates to such printed circuit board assemblies wherein compliant pins are used to provide desired electrical interconnections between respective components located externally of the board (e.g., wiring, conductors on another circuit board, etc.) and/or elements (e.g., signal and ground planes) typically positioned internally to the board's structure as well as occasionally on the exterior surfaces thereof.

BACKGROUND OF THE INVENTION

Printed circuit board assemblies, sometimes referred to as printed wiring assemblies, are well known in the art as are those utilizing various types of compliant pins therewith. Examples are illustrated in U.S. Pat. Nos., 3,545,080 (Evans), 4,017,143 (Knowles), 4,076,356 (Tamburro), 4,381,134 (Anselmo et al), 4,475,780 (Walter et al), 4,533,204 (Moynagh, Jr. et al), 4,548,450 (Reimer et al), 4,737,114 (Yaegashi) and 4,763,408 (Heisey et al). Further examples of compliant pins are illustrated in IBM Technical Disclosure Bulletins Vol. 29, No. 3, August 1986 (pp. 1228, 1229) and Vol. 30, No. 12, May 1988 (pp. 235, 236). Other types of circuit board or the like assemblies wherein various connections are provided using contact pins or similar conductive members are illustrated in U.S. Pat. Nos. 3,880,486 (Avakian), 3,971,610 (Buchoff et al), 4,530,551 (Benasutti) and 4,731,701 (Kuo et al).

As will be defined in greater detail hereinbelow, the invention involves the utilization of electrical contact pins of the compliant variety within a circuit board member to provide interconnections between opposing sides of the board and/or internal to the board in a new and unique manner. By the term compliant as used herein is meant to define a contact pin which includes a portion thereof designed for providing an interference (or press) fit within a provided hole located within the board's surface. Such a fit may be achieved with or without the use of solder. As further defined herein, the invention is able to provide such an interconnection while enabling greater utilization of some of the board's interior volume for other purposes, particularly the locating of more circuitry (e.g., lines), thereby increasing the circuit density and the operational capabilities of the total assembly. As also defined, this is possible in the instant invention in a relatively simple and inexpensive manner, thus rendering the invention adaptable to mass production and the several advantages associated therewith. These and other advantageous features are considered to represent a significant advancement in the art, including particularly the art cited hereinabove, and are not taught or suggested by such art.

DISCLOSURE OF THE INVENTION

It is, therefore, a primary object of the invention to enhance the circuit assembly and contact pin art.

It is a further object of the invention to provide a circuit assembly and contact pin for use therein which provides, among others, the advantages cited above.

In accordance with one aspect of the invention, there is provided a circuit assembly comprising a circuit board including a substrate having a surface thereon defining a walled opening therein and at least one electrically conductive layer located within the substrate, the opening occupying a predetermined depth within the substrate and including a layer of electrically conductive material thereon. The layer of conductive material is electrically coupled to the conductive layer within the substrate to provide a circuit path between the conductive layer and the conductive material. The assembly also includes a contact pin including a compliant end portion positioned within the walled opening within the substrate and in electrical contact with the respective layer of conductive material thereon, and an extending portion extending from the respective surface of the circuit board and adapted for being electrically coupled to an electrical component located externally of the board to thereby provide electrical interconnection between the component and the conductive layer within the substrate.

In accordance with another aspect of the invention, there is provided a circuit assembly comprising a circuit board including a substrate having first and second opposed surfaces thereon, each of the surfaces defining a walled opening therein occupying a predetermined depth within the board. At least one of the walls of each of the walled openings includes a layer of electrically conductive material thereon, the layers of conductive material being electrically coupled to provide a circuit path between each of the walled openings. First and second contact pins are also utilized, each of the contact pins including a compliant end portion positioned within a respective one of the walled openings within the board and in electrical contact with the respective layer of conductive material, and an extending portion extending from the respective surface of the circuit board and adapted for being electrically coupled to an electrical component located externally of the board to thereby provide electrical interconnection between the components.

In accordance with still another aspect of the invention, there is provided a contact pin comprising a compliant first end portion for being positioned within the opening within the circuit board to occupy a predetermined depth within the board and to provide an interference fit therein, and an extending second end portion located opposite the first end portion for extending from the board and adapted for being electrically coupled to an electrical component located externally of the board.

BRIEF DESCRIPTION OF THE DRAWINGS

FIG. 1 is a partial side elevational view, in section, of a circuit assembly in accordance with one embodiment of the invention, said FIG. 1 also taken along the lines 1—1 in FIG. 3;

FIG. 2 is a partial perspective view of one of the contact pins of FIG. 1, illustrating one example of a compliant end portion for use therewith; and FIG. 3 is a partial plan view, in section, of the compliant end portion of one of the contact pins of the invention as taken along the line 3—3 in FIG. 1.

BEST MODE FOR CARRYING OUT THE INVENTION

For a better understanding of the present invention, together with other and further objects, advantages and capabilities thereof, reference is made to the following disclosure and appended claims in connection with the above-described drawings.

In FIG. 1, there is shown a circuit assembly 10 in accordance with one embodiment of the invention. Circuit assembly 10 includes a circuit board 11 comprised of an electrically insulative substrate member 13 of known material (e.g., thermosetting resin). As shown in FIG. 1, circuit board 11 is of substantially planar configuration having upper and lower opposed, substantially planar surfaces 15 and 17. Circuit board 11 is only partially shown in FIG. 1, it being understood that the ends (shown segmented in FIG. 1) extend a desired distance to thus define the overall length and width of the finished product. For example, board 11 may have an overall width of from about 10 inches to about 24 inches and a corresponding length of from about 15 inches to about 28 inches. Having such dimensions, the board's overall thickness (distance between surfaces 15 and 17) may be within the range of from about 0.125 to about 0.350 inch, depending on the number of circuit elements (e.g., signal or power planes) desired for use therein. Such signal or power planes are represented by the substantially planar conductive layers 19, 21 and 23 in FIG. 1. It is understood that these are only representative of various configurations for such components and are thus not meant to limit the scope of the invention as defined herein. In the embodiment depicted in FIG. 1, for example, the elements 19 and 23 may serve as power planes for assembly 10 and the interim conductive layer 21 may serve as the signal plane for the invention. In those situations wherein the conductive layer serves as a power plane, such a layer is usually of substantially continuous (solid) planar configuration (as represented by the element depicted by numeral 19). For those of a signal variety, a plurality of individual conductive members typically comprise the spaced, substantially planar configuration represented by the numeral 21, each of these individual members as depicted in FIG. 1 extending in directions toward and away from the viewer of the drawing. The above configurations are representative only and are not meant to limit the invention nor are the number thereof meant to be so limiting. It is well within the scope of this invention to utilize several alternative configurations and/or combinations of these elements and still satisfy the overall objective of the instant invention. It is also understood that lengths, widths and thicknesses other than those mentioned above are also readily possible. Significantly, the invention as defined herein enables the utilization of relatively shallow compliant pins within opposed surfaces of such a relatively thin component (circuit board) to provide the electrical connections defined herein.

As shown in FIG. 1, located within each of the opposed surfaces 15 and 17 of board 11 is a walled opening 25, each of which, as also shown in FIG. 3, is preferably of substantially cylindrical configuration and, significantly, occupies only a predetermined depth within the substrate 13 and thus does not pass entirely therethrough. Being substantially cylindrical in configuration, each opening is defined by an angular, vertical continuous wall 27 and a lower, substantially flat wall 29. It is understood that other configurations for opening 25 are readily possible, including oval, elliptical and rectangular.

Located on walls 27 and 29 of each cylindrical opening 25 is a layer of electrically conductive material 31 (e.g., copper), these layers, as shown in FIG. 1, being electrically coupled to each other to thus provide a circuit path between the spaced apart openings 25. In one embodiment of the invention, each of the openings 25 possessed a diameter of only about 0.018 inch, with the corresponding thickness for each of the conductive layers located thereon being about 0.001 inch. This diameter is represented by the dimension W1 in FIG. 1 and also in FIG. 3. The corresponding width for the compliant end portion 45 is thus only about 0.016 inch. Dimension W1 thereby represents the overall width for each of the respective openings 25 which, as also shown in FIG. 1, are substantially similar in such outer dimension.

To provide the electrical circuit path between walled openings 25, there is provided a narrow channel 35 therebetween. Significantly, channel 35 is of a width (W2) substantially less than that of the corresponding width for each of the aforedescribed openings 25. This represents a significant feature of the invention in that it enables greater utilization of board internal volume in the area between the respective, spaced openings 25 that would otherwise be occupied by such openings if of the heretofore continuous, plated through hole (PTH) variety known in the art. Plated through hole technology has been utilized in the art for the purpose of providing pin or similar conductive member placement to thus provide electrical interconnections between respective circuit elements and external components (e.g., a printed circuit board) located externally of the board containing these members. Examples of plated through holes are shown in the aforementioned U.S. Pat. No. 4,381,134. As stated, the instant invention overcomes the disadvantages associated with such plated through holes wherein relatively large quantities of board internal volume were utilized to provide the requisite interconnections. In the instant invention, a significant portion of this volume is saved and thus used in a manner which substantially increases the operational capability of the final product. To provide the interconnection between the layered openings 25, a quantity of electrically conductive material (e.g., copper) 37 is located (e.g., plated) on the internal walls of channel 35. It is also within the scope of the invention to completely fill the narrow channel 35 with such conductive material as shown in FIG. 1, or to leave this central portion void. Whether or not the channel is completely filled is dependent on the overall width (W2) for the channel and the preferred technique for providing the conductive layers as used herein. In a circuit board possessing a thickness within the range cited above and having spaced apart openings 25 of the dimensions also cited above, channel 35 is preferably substantially cylindrical and possesses a width (W2) of only from about 0.002 inch to about 0.010 inch. The corresponding thickness for the plated copper 37 is only from about 0.001 inch to about 0.005 inch.

In a preferred embodiment of the invention, each of the openings 25 are drilled to a prescribed depth (e.g, about 0.031 inch) within the illustrated opposite surfaces of substrate 13. Both openings 25 are preferably coaxially aligned, as indicated in FIG. 1 to thus occupy a common axis A—A. Following the drilling of openings 25, the narrower channel 35 is then drilled (e.g., laser drilled), preferably also along the common axis A—A. Subsequently, both openings 25 and channel 35 are plated with copper using a standard plating operation known in the art. As stated, depending on the overall width (W2) for channel 35, this opening may or may not be completely filled with the conductive copper. Thus, the conductive layers as defined herein for use on the walls of openings 25 and channel 35 are provided in a substantially simultaneous fashion, thereby reducing the overall time (and cost) required to produce the invention.

Located within each of the defined openings 25 are first and second compliant contact pins 41 and 43. Each pin, being of metallic material (e.g, copper, nickel, phosphor bronze, steel) includes what will hereinafter be referred to as a shallow compliant portion 45. By the term shallow is meant to define a contact pin wherein the compliant portion thereof possesses an overall length (L in FIG. 2) within the range of from only about 0.031 inch to about 0.063 inch. This is considered significant in regards to the invention, considering also the very narrow width (e.g., only about 0.016 inch) for the compliant end portion 45. Typical widths for compliant sections of pins known in the art have usually exceeded 0.040 inch.

As shown in FIG. 1, each compliant portion is designed to fit substantially entirely within its respective opening and thus occupy the entire depth thereof. Each pin is designed specifically to be positioned within the respective opening to electrically contact the layered conductive material located therein. As stated, this means of connection is provided using an interference (or press) type of fit. The interference fit between the pin and the respective walled opening provides a gas tight electrical connection. Alternatively, this fit acts to hold the pin in a predetermined fixed alignment for a subsequent sealing operation (e.g., soldering) which would also assure such a gas tight connection. As thus defined, each of the pins 41 and 43 are in electrical contact with the respective conductive material within the openings 25 in which they are positioned and are thus interconnected through the common, conductive channel 35. This arrangement uniquely enables an electrical connection to be achieved between components (e.g, a second circuit board 51, external wiring 53, a conductive socket 57) located external of circuit assembly 10. Significantly, it is also possible using the teachings herein to extend such connections to the respective conductive layers 19, 21 and/or 23 (only 19 and 21 shown as being connected in FIG. 1), if desired. The operational capability of assembly 10 is thus significantly enhanced over printed circuit boards of the prior art and particularly those possessing known plated through holes as part thereof.

Each contact pin 41 and 43 includes the aforementioned compliant end portion 45 for providing the necessary interference fit within the respective opening 25. Extending in a direction substantially opposite from that of the compliant section 45 is an extending end portion 61 which, in accordance with the teachings herein, may be of arbitrary design depending on the operational requirements for assembly 10. In FIG. 1, for example, this extending portion is shown as being substantially flat with curved end section 63 designed to engage the conductive circuitry 65 of the second board 51. It is also within the scope of the invention to provide this extending portion 61 in substantially bifurcated shape having two projecting end sections (not shown) designed to accommodate therebetween board 51 or a similar conductive member. It is even further within the scope of the invention to provide the extending end in the form of a male pin 67 as shown at the lowermost portion of FIG. 1 for second pin 43. Being of such configuration, pin 67 may be ideally connected to wiring 53 or the like, or, alternatively, may be inserted within a conductive socket member 57 as shown (in phantom). It is thus understood that a variety of configurations may be utilized for the extending end portions of contact pins 41 and 43, depending on the operational requirements of assembly 10 in which these pins are used. It is essential, however, that each be provided with the aforedefined compliant end portion for positively seating each pin within the respective opening 25.

To further assist in this positioning each pin preferably includes a flange portion 71 located immediately adjacent each compliant end portion and possessing a stress bearing surface 73 designed for engaging a respective surface (15 or 17) of circuit board 11 when the pin is fully inserted therein. In the event that a conductive layer (e.g, 75) is utilized for assembly 10, the stress bearing surface 73 is also designed for engaging this layer and, therefor, being electrically connected thereto while still providing the seating assistance necessary for the pin. It is preferred that each pin, being of relatively simple configuration, be stamped from appropriate metallic stock. In addition, each pin may be plated (e.g., with tin), if desired.

In FIGS. 2 and 3, there is better illustrated one example of the compliant end portion 45 as might be utilized for each of the contact pins of the invention. As shown, this compliant end portion is of substantially C-shaped configuration and thus includes opposing arms 81 and 83 each having a reduced end thickness to provide the press-fit mounting within plated openings 25. Arms 81 and 83 thus provide uniformly stressed beams to assure the requisite interference (press) fit for each pin. Such a cross-sectional configuration is also shown in U.S. Pat. No. 4,017,143, cited above. It is understood that the C-shaped configuration depicted in FIGS. 1-3 is representative of several which may be successfully utilized in the present invention. Others include an elliptical or oval configuration (which may be substantially solid throughout), an "eye of the needle" configuration shaped similar to that of a sewing needle, (see, e.g., U.S. Pat. No. 4,737,114, cited above), and a "bow tie" configuration. Attention is also directed to the compliant shapes depicted in the aforementioned U.S. Pat. Nos. 4,533,202 and 4,763,408. Such configurations may be used to provide the compliant end portions as taught herein if properly modified in accordance with the teachings of the invention. To further assist in the positioning of pins 41 and 43 within board 11, the respective compliant end portions may be provided with a lubricant prior to pin insertion. Examples of such electrical contact lubricants are known in the art and further description is thus not believed necessary.

Although the invention has been described above with regard to two contact pins located within a respective pair of conductive, walled openings, it is entirely within the scope of the invention to utilize but a singular contact pin within a singular opening and electrically couple the layer of conductive material (e.g., copper) of the opening to one or more of the board's internal conductive layers (signal and/or power planes). To achieve such coupling, it is also possible to use a thin channel or the like, as shown in FIG. 1, should connections deeper within the board than the depth of the walled opening be desired. Regardless, substantial areas of board internal volume are saved to provide the advantages defined herein.

There is thus been shown and described a circuit assembly and contact pin for use therein wherein greater circuit board volume is available while still enabling positive interconnections between designated electrical components and/or internal conductive layers which form part of the finished assembly. This unique interconnection is possible through the use of shallow compliant pins which occupy a shortened depth (e.g., no greater than about 0.031 inch) within the circuit board component. In one embodiment, one pin is employed and electrically coupled to at least one of the internal conductive layers. In another embodiment, two pins are uniquely connected through a common, narrow conductive channel which, as described, may be provided through the use of a drilling or similar operation subsequent to the operation (e.g., drilling) used to provide the openings in which the pins are located. The requirement for solder to provide pin-circuit layer connection is thus eliminated. The invention as defined is thus readily adaptable to mass production and represents a cost savings in comparison to many printed circuit board assemblies of the prior art.

While there have been shown and described what are present considered the preferred embodiments of the invention, it will be obvious to those skilled in the art that various changes in modifications may be made therein without departing from the scope of the invention as defined by the appended claims.

What is claimed is:

1. A circuit assembly comprising:
   a circuit board including a substrate having a surface thereon defining a walled opening therein and at least one electrically conductive layer located within said substrate, said opening being of a first width and occupying a predetermined depth within said substrate but not passing entirely therethrough and including a layer of electrically conductive material thereon, said layer of conductive material being electrically coupled to said conductive layer within said substrate through a channel having electrically conductive material therein and being of a width less than said first width of said opening to provide a circuit path between said conductive layer and said conductive material on said opening; and
   a contact pin including a compliant end portion positioned within said walled opening within said substrate and in electrical contact with said respective layer of conductive material thereon, and an extending portion extending from said respective surface of said circuit board and adapted for being electrically coupled to an electrical component located externally of said board to thereby provide electrical interconnection between said component and said conductive layer within said substrate.

2. The circuit assembly according to claim 1 wherein said layer of conductive material of said walled opening, said electrically conductive material within said channel and said electrically conductive layer within said substrate are each comprised of copper.

3. The circuit assembly according to claim 1 further including at least one electrically conductive layer positioned on said surface of said substrate and in electrical contact with said layer of conductive material within said walled opening.

4. The circuit assembly according to claim 3 wherein said contact pin includes a flange portion adjacent said compliant end portion and having a stress bearing surface thereon for engaging said conductive layer on said surface of said substrate when said compliant portion is positioned within said walled opening.

5. The circuit assembly according to claim 1 wherein said contact pin is metallic.

6. A circuit assembly comprising:
   a circuit board including a substrate having first and second opposed surfaces thereon, each of said surfaces defining a walled opening therein having a first width and occupying a predetermined depth within said board but not passing entirely therethrough, at least one of the walls of each of said walled openings including a layer of electrically conductive material thereon, said layers of conductive material being electrically coupled through a channel having electrically conductive material therein and being of a width less than either of said widths of said walled openigs to provide a circuit path between each of said walled openings; and
   first and second contact pins, each of said contact pins including a compliant end portion positioned within a respective one of said walled openings within said board and in electrical contact with said respective layer of conductive material thereon, and an extending portion extending from said respective surface of said circuit board and adapted for being electrically coupled to an electrical component located externally of said board to thereby provide electrical interconnection between said components.

7. The circuit assembly according to claim 6 wherein said walled openings are located substantially opposite each other within said circuit board in a spaced apart orientation.

8. The circuit assembly according to claim 7 wherein said walled openings and said channel are coaxially aligned.

9. The circuit assembly according to claim 7 wherein said layers of conductive material and said quantity of said conductive material are each comprised of copper.

10. The circuit assembly according to claim 7 further including at least one electrically conductive layer located within said substrate substantially between said spaced apart walled openings.

11. The circuit assembly according to claim 10 wherein said electrically conductive layer is electrically connected to said quantity of conductive material within said channel.

12. The circuit assembly according to claim 10 further including at least one electrically conductive layer positioned on at least one of said opposed surfaces of said substrate and in electrical contact with said layer of conductive material within one of said walled openings.

13. The circuit assembly according to claim 12 wherein at least one of said contact pins includes a flange portion adjacent said compliant end portion and having a stress bearing surface thereon for engaging said conductive layer on said surface of said substrate when said compliant portion is positioned within said respective walled opening.

14. The circuit assembly according to claim 6 wherein at least one of said contact pins includes a flange portion adjacent said compliant end portion and having a stress bearing surface thereon for engaging said respective opposed surface of said substrate when said contact pin is positioned within said respective walled opening.

15. The circuit assembly according to claim 6 wherein each of said contact pins is metallic.

* * * * *